(12) United States Patent
Cho et al.

(10) Patent No.: US 12,322,602 B2
(45) Date of Patent: Jun. 3, 2025

(54) RECESSED METAL ETCHING METHODS

(71) Applicant: Applied Materials, Inc., Santa Clara, CA (US)

(72) Inventors: Wangkeun Cho, Mechanicville, NY (US); Gene Lee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 517 days.

(21) Appl. No.: 17/891,921

(22) Filed: Aug. 19, 2022

(65) Prior Publication Data
US 2023/0083577 A1    Mar. 16, 2023

Related U.S. Application Data

(60) Provisional application No. 63/243,277, filed on Sep. 13, 2021.

(51) Int. Cl.
*H01L 21/3213*    (2006.01)

(52) U.S. Cl.
CPC .. *H01L 21/32138* (2013.01); *H01L 21/32136* (2013.01)

(58) Field of Classification Search
CPC ........ H01L 21/32138; H01L 21/32136; H10B 12/34
USPC ........................................................ 438/572
See application file for complete search history.

(56) References Cited

U.S. PATENT DOCUMENTS

| | | |
|---|---|---|
| 8,309,448 B2 | 11/2012 | Hwang et al. |
| 2006/0097397 A1 | 5/2006 | Russell |
| 2011/0233778 A1 | 9/2011 | Lee et al. |
| 2013/0029465 A1 | 1/2013 | Lee et al. |
| 2014/0042548 A1 | 2/2014 | Liu et al. |

(Continued)

FOREIGN PATENT DOCUMENTS

| | | |
|---|---|---|
| CN | 105244437 A | 1/2016 |
| CN | 106067442 A | 11/2016 |

(Continued)

OTHER PUBLICATIONS

Taiwan Office Action dated Sep. 22, 2023 for Application No. 111134286.

(Continued)

*Primary Examiner* — Quoc D Hoang
(74) *Attorney, Agent, or Firm* — Patterson + Sheridan, LLP

(57) ABSTRACT

Embodiments described herein generally relate to electronic devices and electronic device manufacturing. More particularly, some embodiments of the present disclosure provide methods of manufacturing memory devices, for example, dynamic random-access memory cells with buried word-lines. In an embodiment, a method of manufacturing an electronic device is provided. The method includes recessing a metal layer to a first predetermined depth to form a recessed metal layer. The metal layer at least partially fills each feature of a plurality of features formed on a substrate and each feature has a feature depth. The method further includes exposing the recessed metal layer to a carbon-containing plasma to form a metal-carbide layer on the recessed metal layer. The method further includes recessing the recessed metal layer to a second predetermined depth by etching the metal-carbide layer and the recessed metal layer.

20 Claims, 5 Drawing Sheets

(56) References Cited

U.S. PATENT DOCUMENTS

| | | |
|---|---|---|
| 2016/0293441 A1 | 10/2016 | Lee et al. |
| 2016/0314985 A1* | 10/2016 | Yang ................. H01J 37/32926 |
| 2018/0053660 A1 | 2/2018 | Jandl et al. |
| 2018/0102236 A1 | 4/2018 | Yang et al. |
| 2020/0176451 A1 | 6/2020 | Kang et al. |
| 2020/0202900 A1 | 6/2020 | Kang et al. |
| 2020/0251151 A1 | 8/2020 | Kang et al. |
| 2020/0286897 A1 | 9/2020 | Panda et al. |

FOREIGN PATENT DOCUMENTS

| | | |
|---|---|---|
| EP | 1003219 A2 | 5/2000 |
| KR | 101020160126890 | 1/2016 |

OTHER PUBLICATIONS

Korean Office Action dated Feb. 4, 2024 Patent Application No. 10-2022-0113460.
International Search Report and Written Opinion dated Dec. 14, 2022 for Application No. PCT/US2022/040992.
Taiwan Office Action dated Sep. 4, 2024 for Application No. 111134286.

\* cited by examiner

RECESSED METAL ETCHING METHODS

CROSS-REFERENCES TO RELATED APPLICATIONS

This application claims benefit of and priority to U.S. Provisional Patent Application Ser. No. 63/243,277, filed on Sep. 13, 2021, which is incorporated herein by reference in its entirety.

BACKGROUND

Field

Implementations of the present disclosure generally relate to electronic devices and electronic device manufacturing. More particularly, some implementations of the present disclosure provide memory devices, for example, dynamic random-access memory cells with buried word-lines.

Description of the Related Art

Fabrication of semiconductor devices includes forming (for example, patterning) one or more materials having a desired size and spacing. For example, conductive materials can be patterned into conductive lines, such as access lines (for example, word-lines), digit lines (for example, sense lines, bitlines), conductive contacts, and conductive traces. Other features can be patterned to form, for example, select devices of memory cells, memory storage elements, and other components of electronic devices.

As the feature size of electronic devices continues to shrink, it is more and more difficult to form patterns of features having uniform critical dimensions. This variance in critical dimensions between features can lead to pattern-related differences. Pattern-related differences, such as these are referred to as pattern loading effects (PLE). For example, conductive material deposited in wide features generally etches at a faster rate than the same conductive material deposited in narrow features. This variance in etching rate can lead to depth variation of the material deposited in the wide features verses the narrow features, which can adversely affect subsequent processing.

Accordingly, there is a need for improved methods of etching conductive materials formed in features formed on a substrate.

SUMMARY

Implementations of the present disclosure generally relate to electronic devices and electronic device manufacturing. More particularly, some implementations of the present disclosure provide memory devices, for example, dynamic random-access memory cells with buried word-lines.

In an aspect, a method of manufacturing an electronic device is provided. The method includes recessing a metal layer to a first predetermined depth to form a recessed metal layer. The metal layer at least partially fills each feature of a plurality of features formed on a substrate and each feature has a feature depth. The method further includes exposing the recessed metal layer to a carbon-containing plasma to form a metal-carbide layer on the recessed metal layer. The method further includes recessing the recessed metal layer to a second predetermined depth by etching the metal-carbide layer and the recessed metal layer.

Implementations can include one or more of the following. The metal layer can include copper (Cu), cobalt (Co), tungsten (W), aluminum (Al), ruthenium (Ru), iridium (Ir), molybdenum (Mo), platinum (Pt), tantalum (Ta), titanium (Ti), rhodium (Rh), or a combination thereof. The carbon-containing plasma can include plasma effluents of a carbon-containing gas, an inert gas, and optionally oxygen. The carbon-containing gas can be selected from methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), isomers thereof, or a combination thereof. The inert gas can be argon (Ar). The second predetermined depth can be less than about 50% of the feature depth. The first predetermined depth can be less than or equal to about 90% of the feature depth. The recessed metal layer forms a buried word-line and the electronic device can be a dynamic random access memory device.

In another aspect, a method of manufacturing an electronic device is provided. The method includes providing a substrate having a plurality of trenches thereon, each trench having a trench depth and filled with a metal layer having a thickness greater than the trench depth. The method further includes performing a bulk etch to remove a first portion of the metal layer to a first predetermined depth to form a recessed metal layer. The method further includes exposing the recessed metal layer to a carbon-containing plasma to form a metal-carbide layer on the recessed metal layer. The method further includes performing a trench etch to remove a second portion of the recessed metal layer to a second predetermined depth within the plurality of trenches. The metal-carbide layer is disposed on the recessed metal layer during the trench etch.

Implementations can include one or more of the following. The metal layer can include copper (Cu), cobalt (Co), tungsten (W), aluminum (Al), ruthenium (Ru), iridium (Ir), molybdenum (Mo), platinum (Pt), tantalum (Ta), titanium (Ti), rhodium (Rh), or a combination thereof. The carbon-containing plasma can include plasma effluents of a carbon-containing gas, an inert gas, and optionally oxygen. The carbon-containing gas can be selected from methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), isomers thereof, or a combination thereof. The bulk etch can include exposing the substrate to plasma effluents of a chlorine-containing gas precursor and an oxygen-containing gas precursor. The trench etch can include exposing the substrate to plasma effluents of the chlorine-containing gas precursor and the oxygen-containing gas precursor. The recessed metal layer can form a buried word-line and the electronic device is a dynamic random access memory device.

In yet another aspect, a method of manufacturing an electronic device is provided. The method includes providing a substrate having a plurality of trenches thereon, each trench having a trench depth, an opening width, and filled with a metal layer having a thickness greater than the trench depth. A first trench has a first opening greater than a second opening of a second trench. The method further includes recessing the metal layer to a first predetermined depth to form a recessed metal layer in the first trench and the second trench. The method further includes exposing the recessed metal layer to a carbon-containing plasma to form a metal-carbide layer on the recessed metal layer in the first trench and the second trench. The metal-carbide layer in the first trench is thicker than the metal-carbide layer in the second trench. The method further includes recessing the recessed metal layer to a second predetermined depth while the metal-carbide layer is disposed on the recessed metal layer, an etch rate of the metal-carbide layer and the recessed metal layer in the second trench is greater than an etch rate of the metal-carbide layer and the recessed metal layer in the first trench.

Implementations can include one or more of the following. The metal layer can include ruthenium or tungsten. The carbon-containing plasma can include plasma effluents of methane and argon. Recessing the metal layer to a first predetermined depth can include exposing the substrate to plasma effluents of chlorine ($Cl_2$) and oxygen ($O_2$). The second predetermined depth can be less than about 50% of the trench depth. The first predetermined depth can include less than or equal to about 90% of the trench depth.

In yet another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
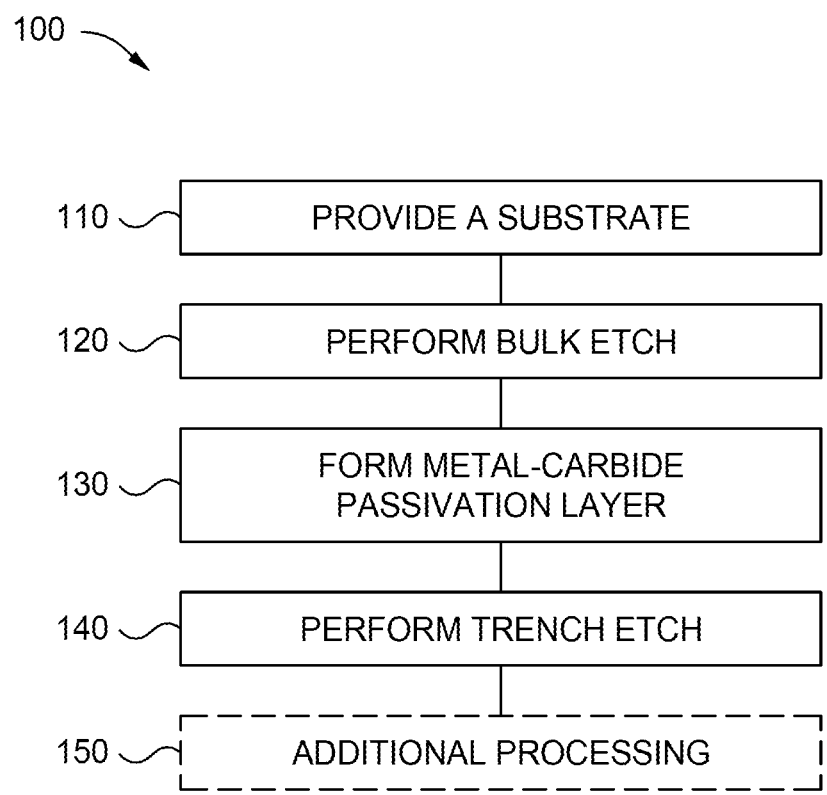
FIG. 1 illustrates a flowchart of a method of etching a feature in a substrate according to one or more aspects of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes processes of etching of conductive features formed on a substrate. Certain details are set forth in the following description and in FIGS. 1-3 to provide a thorough understanding of various implementations of the disclosure. Other details describing well-known structures and systems often associated with etching are not set forth in the following disclosure to avoid unnecessarily obscuring the description of the various implementations. In addition, the apparatus description described herein is illustrative and should not be construed or interpreted as limiting the scope of the implementations described herein.

Many of the details, operations, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations of the present disclosure relate to methods of etching of conductive materials used in electronic devices including, conductive features and methods for forming conductive features with improved uniformity in the etched feature depth, for example, bitline structures or buried word-line structures (bWL) formed in DRAM devices.

Current conventional etch processes typically etch metallic materials deposited in features having different critical dimensions at different rates, which can lead to pattern or depth loading issues. Implementations described herein use a metal-carbide passivation layer to provide a more uniform etch rate of metallic materials in features having different dimensions.

As used herein, the term "dynamic access random memory" or "DRAM" refers to a memory cell that stores a datum bit by storing a packet of charge (or not, for a zero) on a capacitor; the charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. Traditionally, DRAM cells have recessed high work-function metal structures in buried word-line structure. In a DRAM device, a bitline is formed in a metal level situated above the substrate, while the word-line is formed at the polysilicon gate level at the surface of the substrate. In a buried word-line (bWL) device, a word-line is buried below the surface of a semiconductor substrate using a metal as a gate electrode.

In some implementations, types of substrates fabricated from performing disclosed implementations can depend on the aspect ratios of features on the substrate prior to performing disclosed embodiments. Aspect ratios are a comparison of depth of a feature to the critical dimension of the feature (for example, width/diameter). In some implementations, features on a substrate can have an aspect ratio of at least about 2:1, at least about 3:1, at least about 4:1, at least about 6:1, at least about 10:1, or higher. The feature can also have a dimension near the opening, for example, an opening diameter or line width of from about 5 nm to about 500 nm, for example, from about 25 nm to about 300 nm, or from about 10 nm to about 100 nm. The feature can also have a depth of from about 10 nm to about 1000 nm, for example, from about 50 nm to about 300 nm or from about 75 nm to about 100 nm. In at least one example for a DRAM application, the feature has a line width of from about 10 nm to about 40 nm with a line spacing from about 10 nm to about 30 nm (for example, ~24 nm line width with ~20 nm space; ~35 nm line width with ~30 nm space; or ~12 nm line width with ~6 nm space.)

One or more implementations of the disclosure generally provide structures, which include one or more low-resistivity features formed from a thin film refractory metal (for example, ruthenium, tungsten, molybdenum, cobalt) as, can be implemented in bitline structures, word-line structures, and/or gate stacks. Some implementations include methods for forming word-line structures. By way of example, a word-line structure formed in accordance with implementations of the present disclosure can be a memory type semiconductor device, such as a DRAM type integrated circuit.

FIG. 1 illustrates a flowchart of a method 100 of etching a feature in a substrate according to one or more aspects of the present disclosure. FIGS. 2A-2E illustrate various stages of an etching process for forming an electronic device 200 according to one or more aspects of the present disclosure.

Although method 100 and FIGS. 2A-2E are discussed in the context of etching a metal-containing layer deposited in a high aspect ratio feature, for example, a trench, it should be understood that method 100 can be used to etch other features in other types of substrates. In general, the method 100 is applicable to HAR processes of DRAM, flash memory and logic devices as well as HAR line/space patterns (for example, for gate line, bitline, word-line, and interconnect line etches). For example, in DRAM applications, line/space etches for forming buried word-lines.

Figure 2A:
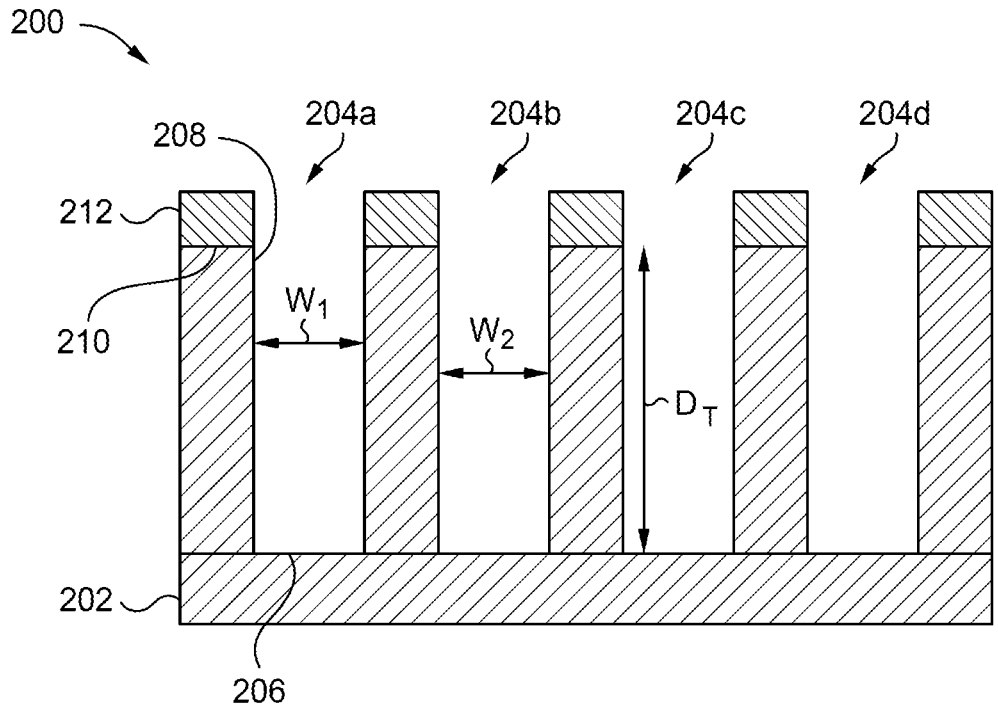
FIGS. 2A-2F illustrate various stages of an etching process for forming an electronic device according to one or more aspects of the present disclosure.

Referring to FIG. 2A, the method 100 begins at operation 110 by providing a substrate. The substrate can be the substrate 202 depicted in FIG. 2A. The substrate 202 can be a silicon substrate. The substrate 202 includes a plurality of features, for example, a plurality of trenches 204a-204d (collectively, trenches 204) therein. The trenches 204 form a recessed channel. The trenches 204 have a bottom 206 and sidewall(s) 208. As will be recognized by one of skill in the art, a width of each trench 204 is defined by the sidewall(s) 208. The plurality of trenches 204 can be formed so as to have a width within a range of from about 5 nm to about 500 nm including, but not limited to a range of from about 10 nm to about 100 nm, from about 10 nm to about 80 nm, from about 10 nm to about 70 nm, from about 10 nm to about 60 nm, from about 10 nm to about 50 nm, or from about 10 nm to about 40 nm. In some implementations, one or more of the trenches 204 can have different widths relative to each other. For example, the first trench 204a has a width "W1" and the second trench 204b has a width "W2," wherein the width "W2" is greater than the width "W1." Although method 100 is discussed relative to trenches having different critical dimensions, method 100 is also applicable to features having similar widths or critical dimensions relative to each other.

The plurality of trenches 204 can be formed so as to have a depth within a range of from about 10 nm to about 1,000 nm, including, but not limited to a range of from about 50 nm to about 300 nm, a range of from about 75 nm to about 100 nm, a range of from about 120 nm to about 250 nm, a range of from about 120 nm to about 150 nm, from about 150 nm to about 200 nm, from about 200 nm to about 250 nm, from about 120 nm to about 200 nm, or from about 150 nm to about 250 nm. As will be recognized by one of skill in the art, the depth of the plurality of trenches 204 or features is defined by the distance "DT" from a surface 210 of the substrate 202 to the bottom 206 of the plurality of trenches 204.

A "substrate" as used herein, refers to at least a surface of a material, or a portion of a surface or a material upon which processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, doped amorphous silicon, polysilicon, doped polysilicon, germanium, gallium arsenide, glass, sapphire, and any other materials such as metals, metal nitrides, metal alloys, and other conductive materials, depending on the application. Substrates include, without limitation, semiconductor wafers. In addition to film processing directly on the surface of the substrate itself, in the present disclosure, any of the film processing steps disclosed can also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate can be a silicon wafer, for example, a 200-mm wafer, a 300-mm wafer, or a 450-mm wafer, including wafers having one or more layers of material such as dielectric, conducting, or semi-conducting material deposited thereon. A patterned substrate can have "features" such as vias or contact holes, which can be characterized by one or more of narrow and/or re-entrant openings, constrictions within the features, and high aspect ratios. The features can be formed in one or more of the above-described layers. One example of a feature is a hole or via in a semiconductor substrate or a layer on the substrate. Another example is a trench in a substrate or layer. In some implementations, the feature can have an under-layer, such as a barrier layer or adhesion layer. Non-limiting examples of under-layers include dielectric layers and conducting layers, for example, silicon oxides, silicon nitrides, silicon carbides, metal oxides, metal nitrides, metal carbides, and metal layers.

In the implementations shown in FIG. 2A, the substrate 202 has one or more pad layer(s) 212 stacked on the substrate 202. In order to form the plurality of trenches 204, the one or more pad layer(s) can be patterned and used as a mask layer to form the plurality of trenches 204. The one or more pad layer(s) 212 can include a pad oxide layer (for example, a silicon oxide layer) formed on the surface 210 of the substrate 202, and/or a pad nitride layer (for example, a silicon nitride layer) can be formed. In some implementations, the one or more pad layer(s) 212 includes one or more of silicon oxide, silicon nitride, silicon oxynitride, silicon carbide, or silicon carbonitride. In at least one example, the one or more pad layer(s) 212 comprises or consists of silicon oxide. In another example, the one or more pad layer(s) comprises or consists of silicon nitride. In yet another example, the one or more pad layer(s) comprises or consists of a silicon oxide layer formed on the substrate 202 and a silicon nitride layer formed on the silicon oxide layer. In addition, the substrate 202 can include additional layers, which are not shown for the sake of simplicity. For some DRAM applications, the substrate 202 can further include gate oxide layers, work-function metal layers, barrier materials (for example, titanium nitride, tantalum nitride, or combinations thereof), and/or cap materials. For example, a gate oxide layer (not shown) can be formed along the sidewall(s) 208 of the trenches 204 and a liner nitride layer (not shown) can be formed on the gate oxide layer.

In the implementation shown in FIG. 2A, the electronic device 200 includes the substrate 202 having the one or more pad layer(s) 212 disposed thereon. The substrate 202 without the one or more pad layer(s) 212 (i.e., just the substrate 202) can also be processed according to the method 100.

Figure 2B:
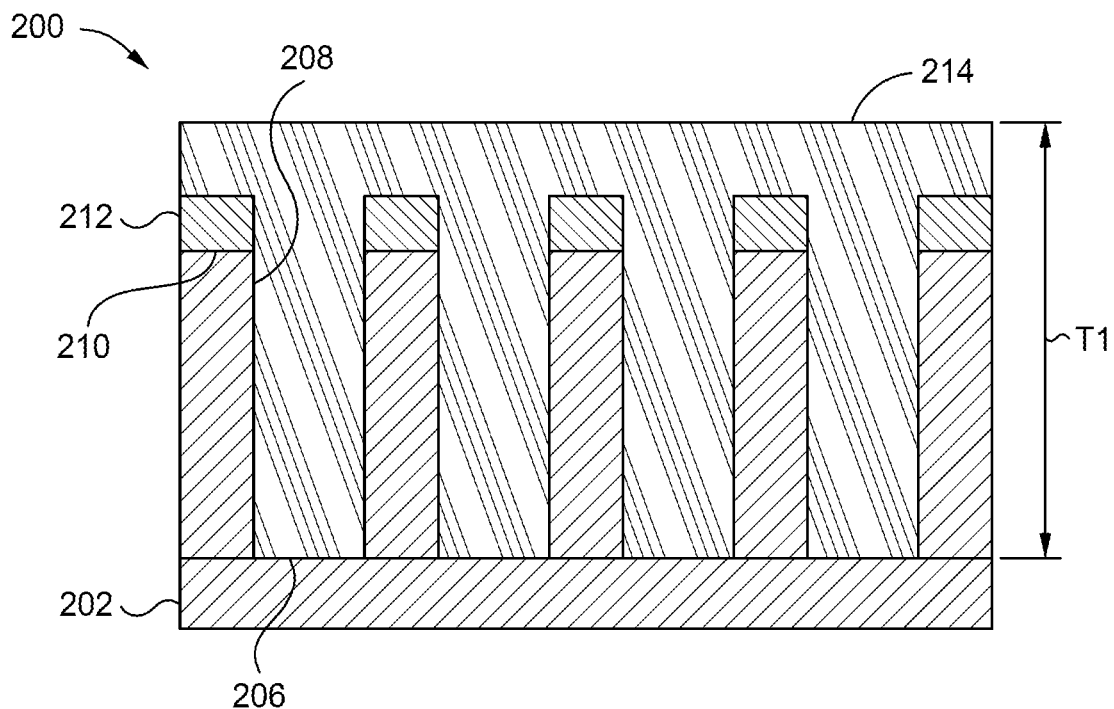

Referring to FIG. 2B, a metal layer 214 is formed on the one or more pad layer(s) 212 and the substrate 202 filling the plurality of trenches 204. The metal layer 214 can be deposited using any one of a number of methods known to one of skill in the art, including, but not limited to, chemical vapor deposition, physical vapor deposition, or atomic layer deposition. In some implementations, the thickness "T1" of the metal layer 214 is controlled. In some implementations, the thickness "T1" of the metal layer 214 is controlled relative to the depth "DT" of the plurality of trenches 204. In some implementations, the thickness "T1" of the metal layer 214 at least fills the trenches 204. Stated differently, the thickness "T1" of the metal layer 214 is greater than or equal to the depth D1 of the trenches 204. In those implementations in which the thickness "T1" is in excess of the depth "D1" of the trenches 204, an overburden of the metal layer 214 can be formed on the surface 210 of the substrate 202.

In some implementations, the metal layer 214 comprises, consists essentially of, or consists of copper (Cu), cobalt (Co), tungsten (W), aluminum (Al), ruthenium (Ru), iridium (Ir), molybdenum (Mo), platinum (Pt), tantalum (Ta), titanium (Ti), rhodium (Rh), or a combination thereof.

In some implementations, the metal layer 214 comprises, consists essentially of, or consists of a grain growth metal layer such as ruthenium, which grows grains at normal thermal budgets for memory manufacturing (for example, about 900 degrees Celsius (° C.) at about five minutes). In at least one example, the metal layer 214 comprises, consists essentially of, or consists of ruthenium. As used herein, the term "consists essentially of ruthenium" means that the ruthenium or component of the metal layer 214 is greater than or equal to about 95%, 98%, or 99% of the metal layer 214. In at least one example, the metal layer 214 forms a buried word-line structure. The buried word-line can comprise, consist essentially of, or consist of ruthenium.

Figure 2C:
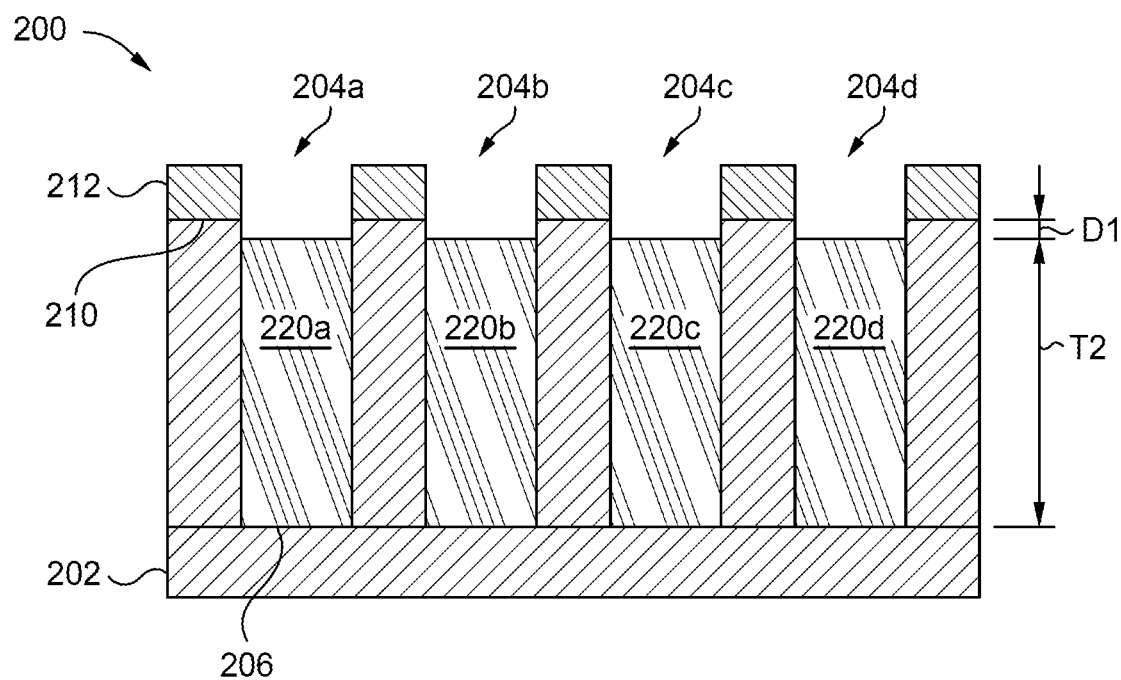

Referring to FIG. 2C, the method 100 continues at operation 120 by performing a bulk etch process. The bulk etch process of operation 120 removes any overburden of the metal layer 214 (if present) and recesses the metal layer 214 to a first predetermined depth "D1" from the surface 210 of the substrate 202 to form a recessed metal layer 220a-220d (collectively, recessed metal layer 220) in the plurality of trenches 204. In some implementations, the first predetermined depth "D1" is from a top surface of the pad layer 212. The recessed metal layer 220 has a thickness "T2". In some implementations, the thickness "T2" is less than or equal to about 90%, less than or equal to about 80%, less than or equal to about 75%, less than or equal to about 70%, less than or equal to about 60%, less than or equal to about 50%, less than or equal to about 40%, less than or equal to about 30%, less than or equal to about 25%, or less than or equal to about 20% of the depth "D1" of the plurality of trenches 204. The substrate 202 can be positioned on a substrate support pedestal, such as a substrate support pedestal 335 in the plasma processing chamber 300 depicted in FIG. 3.

The bulk etch process can include contacting the metal layer 214 with a halide and oxygen-containing chemistry. The halide and oxygen-containing chemistry can be in the form of a gas, a plasma, or a reactive species. The bulk etch process can include contacting the metal layer 214 with halide and oxygen-containing gases or gas mixtures, which adhere to a surface of the metal layer 214 by adsorption or chemisorption onto the metal layer 214. The bulk etch process can include contacting the metal layer 214 with plasma effluents of a halide and oxygen-containing plasma. An oxygen-containing gas, a halogen-containing gas, or a mixture thereof can be flowed into the processing region to form an in-situ plasma or into a remote plasma region to produce plasma effluents. The plasma effluents can be flowed into the processing region to interact with exposed surfaces of the metal layer 214. In the context of the present document, "reacting" or "reaction" refers to a change or transformation in which a substance decomposes, combines with other substances, or interchanges constituents with other substances.

In some implementations, the bulk etch process performed at operation 120 includes exposing the substrate 202 to an etching gas mixture in the presence of an energy source. The etching gas mixture includes an oxygen-containing gas, a halogen-containing gas, and optionally an inert gas. The oxygen-containing gas can be selected from $O_2$, $H_2O$, $H_2O_2$, $O_3$, $N_2O$, $NO_2$, or a combination thereof. In at least one example, the oxygen-containing gas is selected from $O_2$, $O_3$, or a combination thereof. Not to be bound by theory but it is believed that oxygen reacts with the metal layer 214, for example, a ruthenium layer, to form etch by-products, which can easily pumped from the processing chamber. The halogen-containing gas can be selected from a halogen, $Cl_2$, HCl, HF, $F_2$, $Br_2$, HBr, $SF_6$, $NF_3$, or a combination thereof. In at least one example, the halogen-containing gas is $Cl_2$. If present, the inert gas can include argon (Ar), helium (He), xenon (Xe), krypton (Kr), nitrogen, or a combination thereof. In at least one example, the oxygen-containing gas is $O_2$ and the halogen-containing gas is $Cl_2$. Operation 120 is conducted such that removal of the surface material of the metal layer 214 to be removed or etched is favored over other surface materials present on the substrate 202. Not to be bound by theory, but it is believed that operation 120 forms a thin reactive surface layer on the metal layer 214 with a thickness that is more easily removed than unmodified surfaces. For example, in at least one implementation where the metal layer 214 is ruthenium, $Cl_2$ and $O_2$ plasma species form covalent bonds with the exposed ruthenium surfaces (for example, Ru→$RuO_2$—$RuO_2Cl_x$→$RuO_4+Cl_2$).

In some implementations, a plasma based on the etching gas mixture can be generated during operation 120. The species generated from the etching gas mixture-based plasma can be generated in-situ by forming a plasma in the process chamber housing the substrate or can be generated remotely in a process chamber that does not house the substrate such as a remote plasma generator, and can be supplied into the process chamber housing the substrate. In some implementations, the plasma can be an inductively coupled plasma or a capacitively coupled plasma or a microwave plasma. Typically, the plasma power source is capable of producing up to about 3000 W at a tunable frequency in a range that is from about 50 KHz to about 13.56 MHz. The plasma power source can be operable in a continuous wave (CW) or pulsed mode. Power for an inductively coupled plasma can be set at from about 50 W and about 2000 W, such as about 1500 W. In at least one example during operation 120, the plasma power source produces about 1500 W at about 13.56 MHz in a continuous wave mode.

In some implementations, a low radio frequency (RF) bias power of less than about 500 Watts (W) is applied to ions formed from the oxygen and the halogen-containing gas to bombard the substrate with low energy. The low RF bias power reduces spontaneous etching of the surface of the substrate by the modification gas mixture while allowing for chemisorption of the modification gas chemistry on exposed surfaces of the substrate. In at least one example, the bias RF power is maintained at from about 10 W to about 500 W, for example, from about 10 W to about 200 W, such as, from about 50 W to about 65 W.

In at least one example, during operation 120, for a 300 mm substrate, the oxygen-containing gas can flow into the processing region at a rate of from about 100 standard cubic centimeters per minute (sccm) to about 500 sccm, such as from about 200 sccm to about 300 sccm. The halogen-containing gas can flow into the processing region at a rate of from about 10 sccm to about 400 sccm, such as from about 200 sccm to about 250 sccm. The source RF power can be maintained at from about 50 W to about 3000 W, such as from about 1000 W to about 1500 W at a RF voltage from about 0 Volts (V) to about 500 V. The bias RF power can be maintained at from about 10 W to about 500 W, such as from about 100 W to about 200 W at a RF voltage from about 0 V to about 500 V, such as from about 50 V and about 250 V, for example, less than about 200 V.

The substrate temperature during operation 120 can be controlled at from about or at −100° C. to about or at 300° C., such as from about or at −90° C. to about or at −10° C.; from about or at 10° C. to about or at 300° C.; or from about or at 200° C. to about or at 250° C. The overall chamber pressure during operation 120 can be from about or at 1 mTorr to about or at 50 mTorr, for example, from about or at about 10 mTorr to about or at 30 mTorr; or from about or at 10 mTorr to about or at 20 mTorr.

In at least one implementation, the etching gas mixture includes $O_2$ and $Cl_2$. In at least one example, the etching gas mixture comprises, consists essentially of, or consists of ~100-500 sccm of $O_2$ and ~100-500 sccm of $Cl_2$. In another implementation, the etching gas mixture includes $O_2$, $Cl_2$, and Ar. In at least one example, the etching gas mixture comprises, consists essentially of, or consists of ~100-500 sccm of $O_2$, ~100-500 sccm of $Cl_2$, and ~100-200 sccm of Ar.

In some implementations, a purge can be performed after the bulk etch process of operation 120. In a purge operation, non-surface bound oxygen and chlorine species can be removed from the process chamber. This can be done by purging and/or evacuating the process chamber to remove non-adsorbed modification chemistry, without removing the chemisorbed layer. The species generated in a chlorine and oxygen-based plasma can be removed by stopping the plasma and allowing the remaining species to decay, optionally combined with purging and/or evacuation of the chamber. Purging can be done using any inert gas such as $N_2$, Ar, Ne, He, or a combination thereof.

Figure 2D:
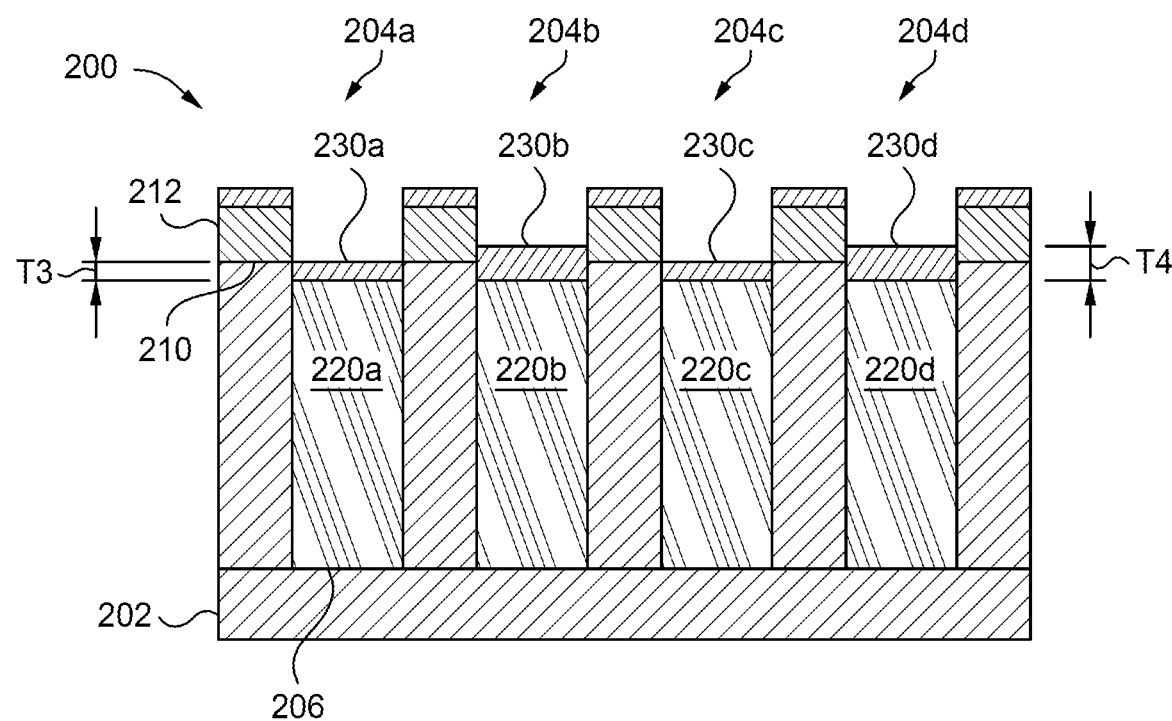

Referring to FIG. 2D, the method 100 continues at operation 130 by forming a metal-carbide layer 230a-230d (collectively, metal-carbide layer 230) on the recessed metal layer 220 present in each trench 204a-204d respectively. Forming the metal-carbide layer 230 includes exposing the exposed surfaces of the recessed metal layer 220 to a carbon-containing plasma to form the metal-carbide layer 230a-230d (collectively, metal-carbide layer 230) on the recessed metal layer 220 present in each trench 204a-204d respectively. The metal-carbide layer is formed from the reaction of the recessed metal layer 220 with the carbon-containing plasma. The metal-carbide layer 230 functions as a passivation layer, which helps control the etch rate of the recessed metal layer 220 underlying the metal carbide layer. The metal-carbide layer 230 forms a thicker layer in features having a larger critical dimension. For example, the metal-carbide layer 230b formed in the trench 204b has a thickness "T4" greater than a thickness "T3" of the metal-carbide layer 230a formed in the trench 204a. In some implementations, the thickness "T3" is from about 1 nanometer (nm) to about 20 nm, for example, from about 1 nm to about 10 nm, such as from about 1 nm to about 5 nm, such as from about 2 nm to about 3 nm. In some implementations, the thickness "T4" is from about 5 nm to about 50 nm, for example, from about 10 nm to about 40 nm, such as from about 10 nm to 30 nm, such as from about 10 nm to about 20 nm or from about 5 nm to about 10 nm. As a result, the etch rate of the trench 204b having the greater critical dimension is slower than the etch rate of the trench 204a having the smaller critical dimension. This reduction in etch rate of the trench 204b having the greater critical dimension results in a smaller variation in trench depth (for example, a more uniform etch depth) between features of different critical dimensions.

In some implementations, operation 130 includes exposing the substrate 202 to a hydrocarbon-containing gas mixture in the presence of an energy source to form the carbon-containing plasma. The hydrocarbon-containing gas mixture includes a hydrocarbon-containing precursor, an inert gas, and optionally an oxygen-containing gas. In one or more embodiments, the hydrocarbon precursor can be or include, but is not limited to, one or more $C_1$-$C_3$ alkyls, one or more $C_2$-$C_3$ alkenes, one or more $C_2$-$C_3$ alkynes, one or more $C_1$-$C_8$ alcohols, one or more $C_1$-$C_8$ ethers, or a combination thereof. In some examples, the hydrocarbon-containing precursor can be or include, but is not limited to, methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), isomers thereof, or a combination thereof. In at least one example, the hydrocarbon-containing precursor includes methane. The inert gas can include argon, helium, xenon, krypton, nitrogen, or a combination thereof. In at least one example, the inert gas includes argon. The oxygen-containing gas can be selected from $O_2$, $H_2O$, $H_2O_2$, $O_3$, $N_2O$, $NO_2$, or a combination thereof. In at least one example, the oxygen-containing gas is selected from $O_2$, $O_3$, or a combination thereof. In at least one example, the hydrocarbon-containing gas mixture includes methane, argon, and optionally oxygen. Not to be bound by theory but it is believed that effluents from the hydrocarbon-containing precursor react with the exposed surfaces of the recessed metal layer 220 to form a metal-carbide. Examples of metal-carbides formed during operation 130 can include copper-carbide, cobalt-carbide, tungsten-carbide, aluminum-carbide, ruthenium-carbide, iridium-carbide, molybdenum-carbide, platinum-carbide, tantalum-carbide, titanium-carbide, rhodium-carbide, or a combination thereof. For example, and in at least one implementation where the recessed metal layer 220 is ruthenium, carbon-containing plasma species form covalent bonds with the exposed ruthenium surfaces to form ruthenium-carbide.

In some implementations, a plasma based on the hydrocarbon-containing gas mixture can be generated during operation 130. The species generated from the hydrocarbon-containing gas mixture-based plasma can be generated in-situ by forming a plasma in the process chamber housing the substrate or can be generated remotely in a process chamber that does not house the substrate such as a remote plasma generator, and can be supplied into the process chamber housing the substrate. In some implementations, the plasma can be an inductively coupled plasma or a capacitively coupled plasma or a microwave plasma. Typically, the plasma power source is capable of producing up to about 3000 W at a tunable frequency in a range that is from about 50 KHz to about 13.56 MHz. The plasma power source can be operable in a continuous wave (CW) or pulsed mode. Power for an inductively coupled plasma can be set at from about 50 W and about 2000 W, such as about 1000 W. In at least one example, and during operation 130, the plasma power source produces about 1000 W at about 13.56 MHz in a continuous wave mode.

In some implementations, formation of the plasma of operation 130 is a bias-free process. In other implementations, a low RF bias power of less than about 500 W is applied during operation 130. In at least one example, the bias RF power is maintained at from about 10 W to about 500 W, for example, from about 10 W to about 200 W, such as, from about 50 W to 65 W.

In at least one example, and during operation 130, for a 300 mm substrate, the hydrocarbon-containing precursor gas can flow into the processing region at a rate of from about 10 sccm to about 500 sccm, for example, from about 50 sccm to about 200 sccm, such as from about 50 sccm to about 150 sccm, such as from about 50 sccm to about 100 sccm. The inert gas can flow into the processing region at a rate of from about 10 sccm to about 500 sccm, for example, from about 50 sccm to about 200 sccm, such as from about 100 sccm to about 200 sccm, such as from about 100 sccm to about 150 sccm. The inert gas can flow into the processing region at a rate of from about 10 sccm to about 500 sccm, for example, from about 50 sccm to about 200 sccm, such as from about 100 sccm to about 200 sccm, such as from about 100 sccm to about 150 sccm. The oxygen-containing gas (if present) can flow into the processing region at a rate of from about 1 sccm to about 100 sccm, for example, from about 1 sccm to about 50 sccm, such as from about 1 sccm to about 10 sccm, such as from about 1 sccm to about 5 sccm. In some implementations, the gases can be mixed prior to flowing into the processing region. The source RF power can be maintained at from about 50 W to about 3000 W, such as from about 1000 W to about 1500 W at a RF voltage from about 0 V to about 500 V.

The substrate temperature during operation 130 can be controlled at from about or at −100° C. to about or at 300° C., such as from about or at −90° C. to about or at −10° C.; from about or at 10° C. to about or at 300° C.; or from about or at 200° C. to about or at 250° C. The overall chamber pressure during operation 130 can be from about or at 1 mTorr to about or at 50 mTorr, for example, from about or at about 10 mTorr to about or at 30 mTorr; or from about or at 10 mTorr to about or at 20 mTorr.

In at least one implementation, the hydrocarbon-containing gas mixture includes $CH_4$ and Ar. In some examples, the hydrocarbon-containing gas mixture comprises, consists essentially of, or consists of ~10-500 sccm of $CH_4$ and ~10-500 sccm of Ar. In some implementations, the hydrocarbon-containing gas mixture includes $CH_4$, Ar, and $O_2$. In at least one example, the hydrocarbon-containing gas mixture comprises, consists essentially of, or consists of ~10-500 sccm of $CH_4$, ~100-50 sccm of Ar, and ~1-10 sccm of $O_2$.

In some implementations, a purge can be performed after the metal-carbide layer formation process of operation 130. In a purge operation, non-surface bound hydrocarbon and inert species are removed from the process chamber. This can be done by purging and/or evacuating the process chamber to remove non-adsorbed modification chemistry, without removing the chemisorbed layer. The species generated in the hydrocarbon and inert gas-based plasma can be removed by stopping the plasma and allowing the remaining species to decay, optionally combined with purging and/or evacuation of the chamber. Purging can be done using any inert gas such as $N_2$, Ar, Ne, He, or a combination thereof.

Figure 2E:
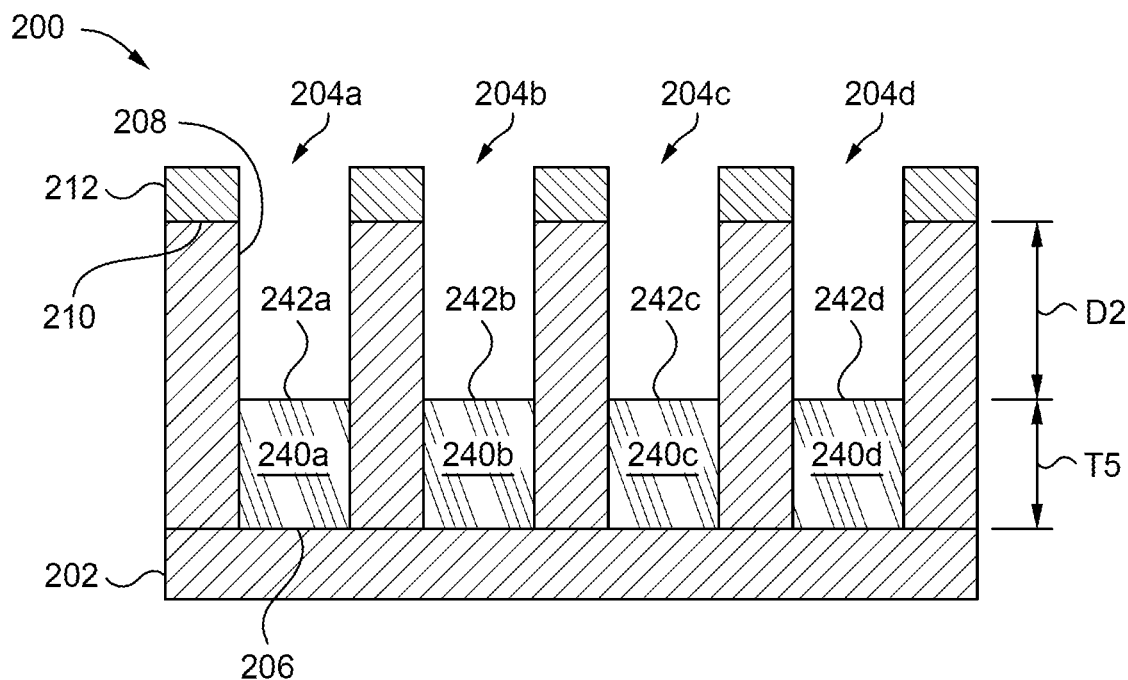

Referring to FIG. 2E, the method 100 continues at operation 140 by performing a trench etch process. The trench etch process of operation 140 removes the metal-carbide layer 230a-230d (collectively, metal-carbide layer 230) and recesses the recessed metal layer 220 present in each trench 204a-204d to a second predetermined depth "D2" to form a second recessed metal layer 240a-240d (collectively, second recessed metal layer 240). The second recessed metal layer 240 does not protrude above the surface 210 of the substrate 202 so that the second recessed metal layer 240 is completely buried within the substrate 202. The second recessed metal layer 240 can function as a buried word-line structure. The second recessed metal layer 240 has a thickness "T5". In some implementations, the thickness "T5" is less than or equal to about 90%, less than or equal to about 80%, less than or equal to about 75%, less than or equal to about 70%, less than or equal to about 60%, less than or equal to about 50%, less than or equal to about 40%, less than or equal to about 30%, less than or equal to about 25%, or less than or equal to about 20% of the depth "D1" of the plurality of trenches 204.

During the trench etch process of operation 140, an etch rate of the thinner metal-carbide layer and the underlying recessed metal layer in the trenches having a smaller critical dimension is greater than an etch rate of the thicker metal-carbide layer and the recessed metal layer in the trenches having a larger critical dimension. For example, since the metal-carbide layer 230b formed in the feature 230b has a thickness "T4" greater than a thickness "T3" of the metal-carbide layer 230a formed in the feature 204a, the etch rate of the trench 204b having the greater critical dimension is slower than the etch rate of the trench 204a having the smaller critical dimension. This reduction in etch rate of the trench 204b having the greater critical dimension results in a smaller variation in trench depth (for example, a more uniform etch depth) between features of different critical dimensions.

The trench etch process of operation 140 can be performed using the process conditions described above for the bulk etch process of operation 120.

In some implementations, a purge can be performed after the trench etch process of operation 140. In a purge operation, non-surface bound oxygen and chlorine species are removed from the process chamber. This can be done by purging and/or evacuating the process chamber to remove non-adsorbed modification chemistry, without removing the chemisorbed layer. The species generated in a chlorine and oxygen-based plasma can be removed by stopping the plasma and allowing the remaining species to decay, optionally combined with purging and/or evacuation of the chamber. Purging can be done using any inert gas such as $N_2$, Ar, Ne, He, or a combination thereof.

In some implementations, operation 130 and operation 140 can be repeatedly performed or cycled in a cycle of metal-carbide layer formation followed by the trench etch process to achieve a targeted etch depth of the metal layer.

Optionally, the method 100 continues at operation 150 by performing additional processing. Additional processing can include but is not limited to low temperature annealing processes, high temperature annealing processes, exposure to a plasma treatment process (for example, exposure to a hydrogen plasma), deposition of additional material layers (for example, high-k dielectric materials, low-k dielectric materials, or metallic layers in the features.

Figure 2F:
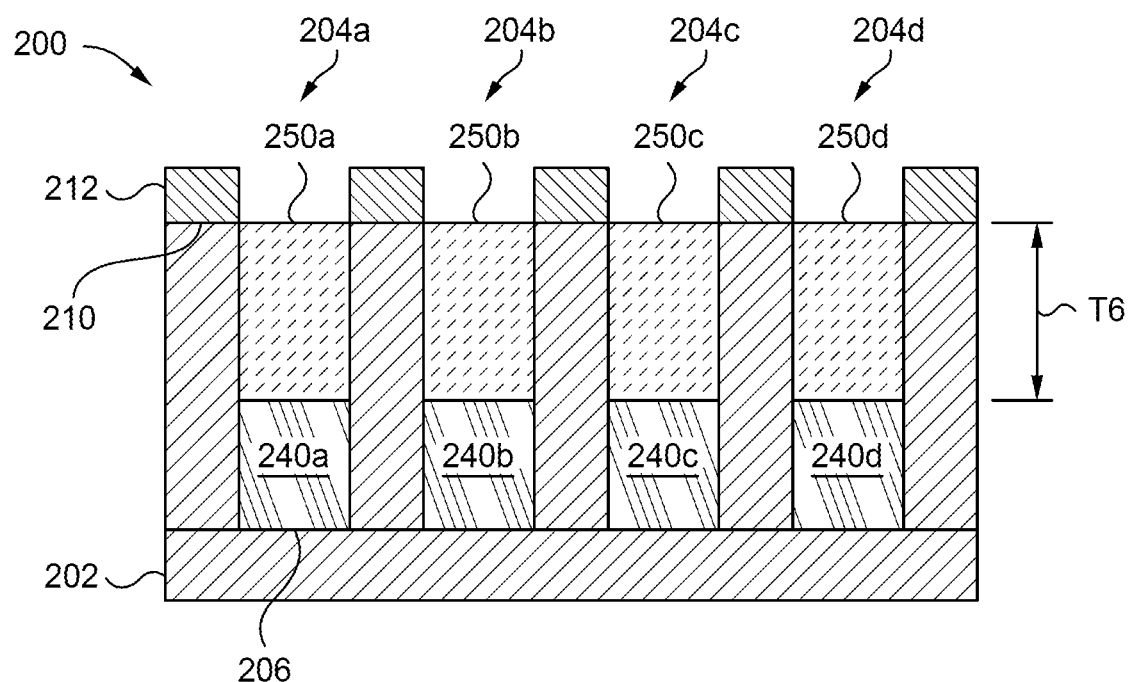

With reference to FIG. 2F, a material layer 250a-250d (collectively, material layer 250) is deposited on a top surface 242a-242d (collectively, top surface 242) of the second recessed metal layer 240 (for example, the buried word line). The material layer 250 can function as a sealing layer. The material layer 250 can be selected from an oxide layer, a nitride layer, and a bi-layer of a nitride and an oxide layer. The material layer 250 can be a dielectric layer. The material layer 250 can be a high density dielectric layer. The high density dielectric layer can be any suitable film with a significantly high density. In some implementations, the high density dielectric layer comprises one or more of SiN or SiCN. In some implementations, the material layer 250 is deposited only within the trenches 204.

The material layer 250 can be deposited with a thickness "T6". In some implementations, as shown in FIG. 2E, "T6" is equal to about "D2." In some implementations, "T6" is less than "D2" and the trench is not completely filled. In some implementations, "T6" is greater than "D2." In some implementations when "T6" is greater than "D2," the material layer 250 is not deposited on the surface 210 of the substrate 202. In some implementations when "T6" is greater than "D2," the material layer 250 is deposited on the surface 210 of the substrate 202 outside of the trenches 204.

Figure 3:
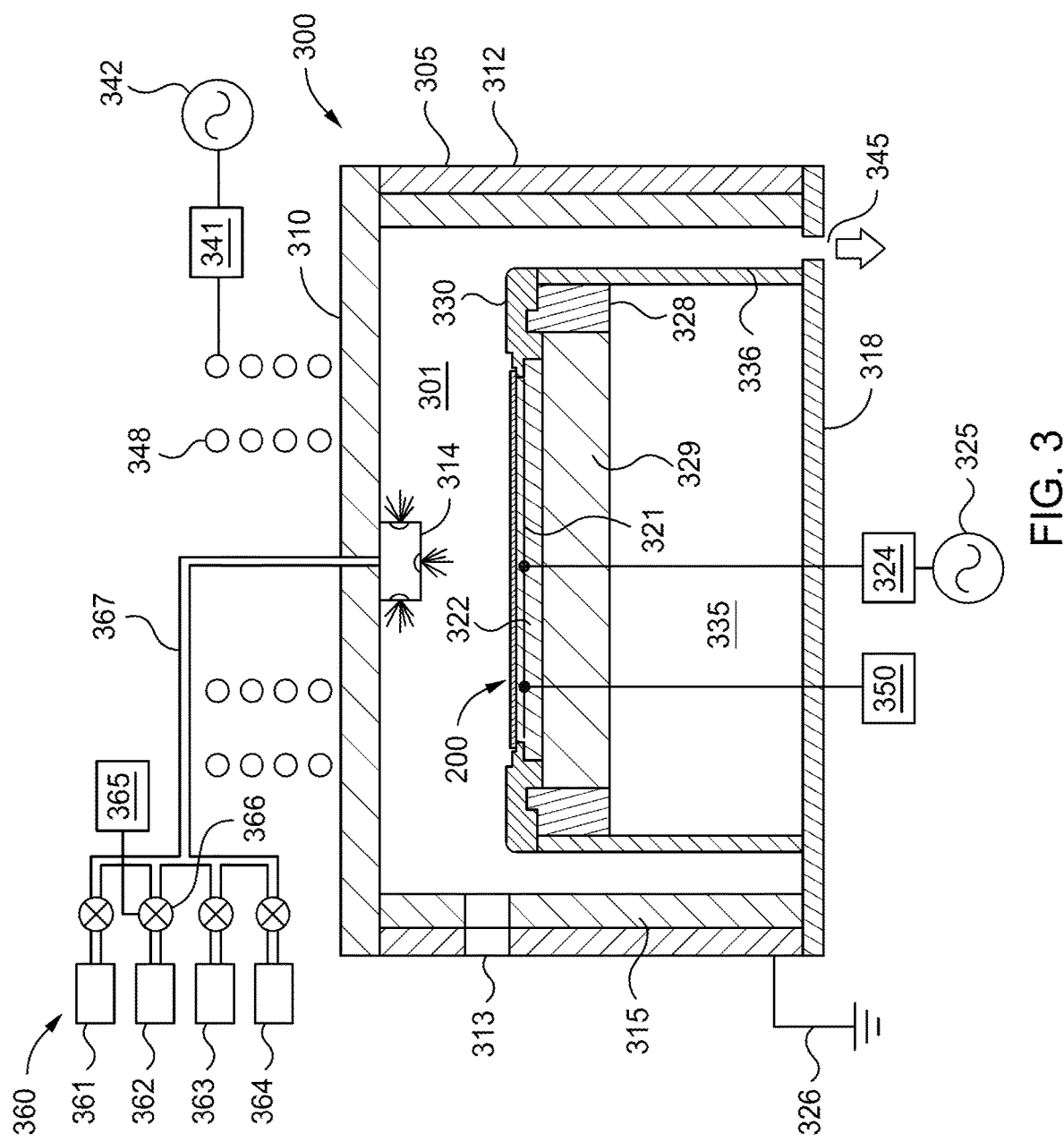
FIG. 3 illustrates a cross-sectional view of one example of a plasma processing chamber that can be used to perform one or more aspects of the present disclosure.

FIG. 3 is a simplified cutaway view for of one example of a plasma processing chamber 300 suitable for patterning a material layer as well as forming a material layer disposed on a substrate 202 in the plasma processing chamber 300. The plasma processing chamber 300 is suitable for performing an etching process as described herein. One example of the plasma processing chamber 300 that can be adapted to benefit from the disclosure is a CENTRIS® SYM3® processing chamber, available from Applied Materials, Inc., located in Santa Clara, California. It is contemplated that other process chambers, including those from other manufactures, can be adapted to practice embodiments of the disclosure.

The plasma processing chamber 300 includes a chamber body 305 having a processing volume 301 defined therein. The chamber body 305 has sidewalls 312 and a bottom 318, which are coupled to ground 326. The sidewalls 312 have a liner 315 to protect the sidewalls 312 and extend the time between maintenance cycles of the plasma processing chamber 300. The dimensions of the chamber body 305 and related components of the plasma processing chamber 300 are not limited and can be proportionally larger than the size of the substrate 202 to be processed therein. Examples of workpiece sizes include 200 mm diameter, 250 mm diameter, 300 mm diameter and 450 mm diameter, among others.

The chamber body 305 supports a chamber lid assembly 310 to enclose the processing volume 301. The chamber body 305 can be fabricated from aluminum or other suitable materials. A substrate access port 313 is formed through the sidewall 312 of the chamber body 305, facilitating the transfer of the electronic device 200 into and out of the plasma processing chamber 300. The substrate access port 313 can be coupled to a transfer chamber and/or other chambers of a substrate processing system (not shown).

A pumping port 345 is defined in the chamber body 305 and connected to the processing volume 301. A pumping device (not shown) is coupled through the pumping port 345 to the processing volume 301 to evacuate and control the pressure of the processing volume 301. The pumping device can include one or more pumps and throttle valves.

A gas panel 360 is coupled by a gas line 367 to the chamber body 305 to supply process gases into the processing volume 301. The gas panel 360 can include one or more process gas sources 361, 362, 363, 364 and can additionally include inert gases, non-reactive gases, and reactive gases, if desired. Examples of process gases that can be provided by the gas panel 360 include, but are not limited to, oxygen-containing gases including $O_2$, $H_2O$, $H_2O_2$, $O_3$, $N_2O$, $NO_2$, or a combination thereof; halogen-containing gases including $Cl_2$, HCl, HF, $F_2$, $Br_2$, HBr, $SF_6$, $NF_3$, or a combination thereof; carbon-containing gases including methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), isomers thereof, or a combination thereof; and inert gases including argon, helium, or a combination thereof. Additionally, process gases can include nitrogen-containing gases, chlorine-containing gases, fluorine-containing gases, oxygen-containing gases, and/or hydrogen-containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$, $H_2$, or combinations thereof, among others.

Valves 366 control the flow of the process gases from the process gas sources 361, 362, 363, 364 from the gas panel 360 and are managed by a system controller 365. The flow of the gases supplied to the chamber body 305 from the gas panel 360 can include combinations of the gases.

The chamber lid assembly 310 can include a nozzle 314. The nozzle 314 has one or more ports for introducing the process gases from the process gas sources 361, 362, 364, 363 of the gas panel 360 into the processing volume 301. After the process gases are introduced into the plasma processing chamber 300, the gases are energized to form plasma. An antenna 348, such as one or more inductor coils, can be provided adjacent to the plasma processing chamber 300. An antenna power supply 342 can power the antenna 348 through a match circuit 341 to inductively couple energy, such as RF energy, to the process gas to maintain a plasma formed from the process gas in the processing volume 301 of the plasma processing chamber 300. Alternatively, or in addition to the antenna power supply 342, process electrodes below the electronic device 200 and/or above the electronic device 200 can be used to capacitively couple RF power to the process gases to maintain the plasma within the processing volume 301. The operation of the antenna power supply 342 can be controlled by a controller, such as the system controller 365 that also controls the operation of other components in the plasma processing chamber 300.

The substrate support pedestal 335 is disposed in the processing volume 301 to support the substrate 202 during processing. The substrate support pedestal 335 can include an electrostatic chuck 322 for holding the substrate 202 during processing. The electrostatic chuck 322 uses the electrostatic attraction to hold the substrate 202 to the substrate support pedestal 335. The electrostatic chuck 322 is powered by an RF power supply 325 integrated with a match circuit 324. The electrostatic chuck 322 includes an electrode 321 embedded within a dielectric body. The electrode 321 is coupled to the RF power supply 325. The electrode 321 provides a bias, which attracts plasma ions, formed by the process gases in the processing volume 301, to the electrostatic chuck 322 and the substrate 202 positioned thereon. The RF power supply 325 can cycle on and off, or pulse, during processing of the substrate 202. The electrostatic chuck 322 has an isolator 328 for the purpose of making the sidewall of the electrostatic chuck 322 less attractive to the plasma to prolong the maintenance life cycle of the electrostatic chuck 322. Additionally, the substrate support pedestal 335 can have a cathode liner 336 to protect the sidewalls of the substrate support pedestal 335 from the plasma gases and to extend the time between maintenance of the plasma processing chamber 300.

Furthermore, the electrode 321 is coupled to a power source 350. The power source 350 provides a chucking voltage of about 200 V to about 2000 V to the electrode 321. The power source 350 can also include a system controller for controlling the operation of the electrode 321 by directing a DC current to the electrode 321 for chucking and de-chucking the substrate 202.

The electrostatic chuck 322 can include heaters disposed therein and connected to a power source (not shown), for heating the substrate, while a cooling base 329 supporting the electrostatic chuck 322 can include conduits for circulating a heat transfer fluid to maintain a temperature of the electrostatic chuck 322 and substrate 202 disposed thereon. The electrostatic chuck 322 is configured to perform in the temperature range desired by the thermal budget of the device being fabricated on the substrate 202. For example, the electrostatic chuck 322 can be configured to maintain the substrate 202 at a temperature of about 25° C. to about 150° C.

The cooling base 329 is provided to assist in controlling the temperature of the substrate 202. To mitigate process drift and time, the temperature of the substrate 202 can be maintained substantially constant by the cooling base 329 throughout the time the substrate 202 is in the plasma processing chamber 300. In at least one implementation, the temperature of the substrate 202 is maintained throughout the etching process at about −10° C. to about 300° C.

A cover ring 330 is disposed on the electrostatic chuck 322 and along the periphery of the substrate support pedestal 335. The cover ring 330 is configured to confine etching gases to a desired portion of the exposed top surface of the substrate 302, while shielding the top surface of the substrate support pedestal 335 from the plasma environment inside the plasma processing chamber 300. Lift pins (not shown) are selectively moved through the substrate support pedestal 335 to lift the electronic device 200 above the substrate support pedestal 335 to facilitate access to the electronic device 200 by a transfer robot (not shown) or other suitable transfer mechanism.

The system controller 365 can be utilized to control the process sequence, regulating the gas flows from the gas panel 360 into the plasma processing chamber 300 and other process parameters. Software routines, when executed by the CPU, transform the CPU into a specific purpose computer (controller) that controls the plasma processing chamber 300 such that the processes are performed in accordance with the present disclosure. The software routines can also be stored and/or executed by a second controller (not shown) that is collocated with the plasma processing chamber 300.

Implementations of the present disclosure generally relate to electronic devices and electronic device manufacturing. More particularly, some implementations of the present disclosure provide memory devices, for example, dynamic random-access memory cells with buried word-lines.

Implementations can include one or more of the following potential advantages. One or more implementations of the disclosure advantageously address the issue of depth loading in spite of the need for shrinking nodes. In some implementations, the depth loading of HAR features having recessed materials deposited therein is improved by exposing the recessed materials to a hydrocarbon plasma coating which slows the etch rate of recessed materials in features having larger critical dimensions relative to recessed materials in features with smaller critical dimensions. This provides a more uniform etch of recessed materials in features of varying critical dimensions.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, for example, a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, for example, an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, for example, code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, for example, EPROM, EEPROM, and flash memory devices; magnetic disks, for example, internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further implementations of the disclosure may be devised without departing from the basic scope thereof, and the scope thereof is determined by the claims that follow.

What is claimed is:

1. A method of manufacturing an electronic device, comprising:
   recessing a metal layer to a first predetermined depth to form a recessed metal layer, wherein the metal layer at least partially fills each feature of a plurality of features formed on a substrate, and wherein each feature has a feature depth;
   exposing the recessed metal layer to a carbon-containing plasma to form a metal-carbide layer on the recessed metal layer; and
   recessing the recessed metal layer to a second predetermined depth by etching the metal-carbide layer and the recessed metal layer.

2. The method of claim 1, wherein the metal layer comprises copper, cobalt, tungsten, aluminum, ruthenium, iridium, molybdenum, platinum, tantalum, titanium, rhodium, or a combination thereof.

3. The method of claim 1, wherein the carbon-containing plasma comprises plasma effluents of a carbon-containing gas, an inert gas, and optionally oxygen.

4. The method of claim 3, wherein the carbon-containing gas is selected from methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), isomers thereof, or a combination thereof.

5. The method of claim 4, wherein the inert gas is argon.

6. The method of claim 1, wherein the second predetermined depth is less than about 50% of the feature depth.

7. The method of claim 6, wherein the first predetermined depth is less than or equal to about 90% of the feature depth.

8. The method of claim 1, wherein:
the recessed metal layer forms a buried word-line; and
the electronic device is a dynamic random access memory device.

9. A method of manufacturing an electronic device, comprising:
providing a substrate having a plurality of trenches thereon, each trench having a trench depth and filled with a metal layer having a thickness greater than the trench depth;
performing a bulk etch to remove a first portion of the metal layer to a first predetermined depth to form a recessed metal layer;
exposing the recessed metal layer to a carbon-containing plasma to form a metal-carbide layer on the recessed metal layer; and
performing a trench etch to remove a second portion of the recessed metal layer to a second predetermined depth within the plurality of trenches, wherein the metal-carbide layer is disposed on the recessed metal layer during the trench etch.

10. The method of claim 9, wherein the metal layer comprises copper, cobalt, tungsten, aluminum, ruthenium, iridium, molybdenum, platinum, tantalum, titanium, rhodium, or a combination thereof.

11. The method of claim 9, wherein the carbon-containing plasma comprises plasma effluents of a carbon-containing gas, an inert gas, and optionally oxygen.

12. The method of claim 11, wherein the carbon-containing gas is selected from methane ($CH_4$), acetylene ($C_2H_2$), ethylene ($C_2H_4$), propylene ($C_3H_6$), propane ($C_3H_8$), hexane ($C_6H_{14}$), benzene ($C_6H_6$), isoprene ($C_5H_8$), butadiene ($C_4H_6$), isomers thereof, or a combination thereof.

13. The method of claim 12, wherein performing the bulk etch comprises exposing the substrate to plasma effluents of a chlorine-containing gas precursor and an oxygen-containing gas precursor.

14. The method of claim 13, wherein performing the trench etch comprises exposing the substrate to plasma effluents of the chlorine-containing gas precursor and the oxygen-containing gas precursor.

15. The method of claim 10, wherein the recessed metal layer forms a buried word-line and the electronic device is a dynamic random access memory device.

16. A method of manufacturing an electronic device, comprising:
providing a substrate having a plurality of trenches thereon, each trench having a trench depth, an opening width, and filled with a metal layer having a thickness greater than the trench depth, wherein a first trench has a first opening greater than a second opening of a second trench;
recessing the metal layer to a first predetermined depth to form a recessed metal layer in the first trench and the second trench;
exposing the recessed metal layer to a carbon-containing plasma to form a metal-carbide layer on the recessed metal layer in the first trench and the second trench, wherein the metal-carbide layer in the first trench is thicker than the metal-carbide layer in the second trench; and
recessing the recessed metal layer to a second predetermined depth while the metal-carbide layer is disposed on the recessed metal layer, wherein an etch rate of the metal-carbide layer and the recessed metal layer in the second trench is greater than an etch rate of the metal-carbide layer and the recessed metal layer in the first trench.

17. The method of claim 16, wherein the metal layer comprises ruthenium or tungsten.

18. The method of claim 16, wherein the carbon-containing plasma comprises plasma effluents of methane and argon.

19. The method of claim 18, wherein recessing the metal layer to the first predetermined depth comprises exposing the substrate to plasma effluents of chlorine ($Cl_2$) and oxygen ($O_2$).

20. The method of claim 19, wherein:
the second predetermined depth is less than about 50% of the trench depth; and
the first predetermined depth is less than or equal to about 90% of the trench depth.

* * * * *